(12) United States Patent
Yamada et al.

(10) Patent No.: US 7,045,949 B2
(45) Date of Patent: May 16, 2006

(54) DISPLAY UNIT

(75) Inventors: Jiro Yamada, Kanagawa (JP); Yuichi Iwase, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/170,923

(22) Filed: Jun. 12, 2002

(65) Prior Publication Data

US 2002/0190639 A1 Dec. 19, 2002

(30) Foreign Application Priority Data

Jun. 15, 2001 (JP) .......................... P2001-181821

(51) Int. Cl.
*H05B 33/00* (2006.01)

(52) U.S. Cl. ...................... 313/504; 313/112

(58) Field of Classification Search ........ 313/504–512, 313/112, 501, 498; 428/690
See application file for complete search history.

(56) References Cited

U.S. PATENT DOCUMENTS

| | | | | | |
|---|---|---|---|---|---|
| 5,682,079 | A | * | 10/1997 | Kang | 313/461 |
| 5,838,105 | A | * | 11/1998 | Mitomo | 313/112 |
| 5,891,554 | A | * | 4/1999 | Hosokawa et al. | 428/690 |
| 5,932,968 | A | * | 8/1999 | Ghosh et al. | 313/112 |
| 6,084,347 | A | * | 7/2000 | Xu et al. | 313/503 |

FOREIGN PATENT DOCUMENTS

| | | |
|---|---|---|
| EP | 0 845 812 A2 | 6/1998 |
| EP | 1 154 676 A1 | 11/2001 |
| JP | 6132081 | 5/1994 |
| JP | 9-127885 | 5/1997 |
| JP | 9-127995 | 5/1997 |
| JP | 10-255983 | 9/1998 |
| JP | 2000-3786 | 1/2000 |
| JP | 2000-315582 | 11/2000 |
| WO | WO 01/39554 | 5/2001 |

OTHER PUBLICATIONS

Austrian Search Report dated Dec. 22, 2003.

* cited by examiner

*Primary Examiner*—Joseph Williams
(74) *Attorney, Agent, or Firm*—Bell, Boyd & Lloyd LLC (57) ABSTRACT

A display unit has R, G, and B light-emitting pixels arranged in a predetermined sequence. The R pixels and the B pixels each have a G-light-absorbing filter at the image display side (light output side or external-light incident side) thereof. The G pixels have no filters. The R and B light-emitting pixels each have a composite structure including a reflective layer, an organic EL layer, and a translucent reflective layer. The translucent reflective layer and the reflective layer constitute an optical resonator that causes multiple interference of light. The transmittance of the G-light-absorbing filter is minimized at the G wavelength, at which the sensitivity of the naked eye is high, and maximized at the R and B wavelengths. Furthermore, the external light reflectance of each pixel is minimized at the G wavelength. This display unit significantly suppresses a decrease in contrast caused by external light without a decrease in luminance of an image.

8 Claims, 8 Drawing Sheets

| | | WITH G-ABSORBING FILTER (%) | WITHOUT FILTER (%) | WITH THREE-COLOR FILTER | WITH TWO-COLOR (R,B) FILTER |
|---|---|---|---|---|---|
| LUMINOUS REFLECTANCE | R LIGHT-EMITTING PIXEL | 3.6 | 47.5 | 5.1 | 5.1 |
| | G LIGHT-EMITTING PIXEL | 15.9 | 15.9 | 5.5 | 15.9 |
| | B LIGHT-EMITTING PIXEL | 8.2 | 32.0 | 1.3 | 1.3 |
| | AVERAGE | 9.2 | 31.8 | 4.0 | 7.4 |

FIG. 10

I# DISPLAY UNIT

BACKGROUND OF THE INVENTION

The present invention relates to display units and, more particularly, to an improvement in a display unit including an organic EL device.

A typical organic electroluminescent (EL) device has a composite structure including an organic EL layer sandwiched by electrodes, one electrode being composed of a metal such as aluminum, the other being a transparent electrode composed of, for example, indium tin oxide (ITO). A proportion of light emitted from the organic EL layer is directly output through the transparent electrode, while light output toward the metal electrode is reflected by the metal electrode and output through the transparent electrode. External light incident on the organic EL layer through the transparent electrode is also reflected by the metal electrode and then output through the transparent electrode. That is, the external light is added to the internal light emitted from the organic EL layer for forming an image. Thus, under external light, such as daylight, the contrast of the image decreases.

A display unit that prevents such a decrease in contrast is disclosed in Japanese Unexamined Patent Application Publication No. 9-127885. The display unit has circular polarization means, which is a combination of a linear polarizer and a quarter wave plate, at a light emitting face. Since the direction of circular polarization of the external light is opposite to the direction of the circular polarization reflected by the display unit, the external light is blocked by the circular polarization means. Japanese Unexamined Patent Application Publication No. 2000-315582 discloses an organic EL device having a visible light-absorbing layer between a cathode and an organic EL layer.

Color filters provided on red (R), green (G), and blue (B) light-emitting pixels and transmitting the R, G, and B light components, respectively, can suppress the reflection of external light other than the R, G, and B light components. However, these color filters cannot suppress the reflection of the R, G, and B light components of the external light. Accordingly, this organic EL device also has a low contrast. Furthermore, an organic EL display unit disclosed in Japanese Unexamined Patent Application Publication No. 2000-3786 has a green color with a main light transmission peak in the range of 490 to 530 nm. The green filter is disposed on a green organic luminescent layer.

These known technologies, however, have the following disadvantages:

(1) Although the display unit disclosed in Japanese Unexamined Patent Application Publication No. 9-127995 can effectively suppress the reflection of external light, the unit decreases the transmittance of light from the organic EL layer. Thus, the luminance is at most 50%.

(2) In the organic EL device disclosed in Japanese Unexamined Patent Application Publication No. 2000-315582, light from the organic EL layer is absorbed in the visible light-absorbing layer. Thus, the luminance is at most 50%.

(3) In a combination of R, G, B filters and corresponding R, G, B pixels, the reflectance of external light is about 30%. Thus, the external light is not effectively removed.

SUMMARY OF THE INVENTION

An object of the present invention is to provide a display unit that can significantly suppress a decrease in contrast caused by external light without a decrease in luminance of an image.

According to an embodiment of the present invention, a display unit includes red, green, and blue pixels arranged in a predetermined sequence, and a filter that absorbs one light component selected from a red light component, a green light component, and a blue light component, the filter being arranged at the output side of light or at the incident side of external light of pixels of colors that are not selected.

In the display unit, the filter may be a green-light-absorbing filter, the filter being arranged at the output side of light or at the incident side of external light of the red and blue pixels. In the display unit, each of the red, green, and blue pixels may have a structure including an organic EL layer between a reflective layer and a transparent layer, the filter being arranged at the output side of light or at the incident side of external light of the transparent layer. Alternatively, each of the red, green, and blue pixels may have a structure including an organic EL layer between a reflective layer and a translucent reflective layer, the filter being arranged at the output side of light or at the incident side of external light of the translucent reflective layer 5.

According to another embodiment of the present invention, a display unit includes red, green, and blue pixels arranged in a predetermined sequence, a red-light-transmitting filter at the output side of light or at the incident side of external light of the red pixels, and a blue-light-transmitting filter at the output side of light or at the incident side of external light of the blue pixels, wherein no filter is arranged at the output side of light or at the incident side of external light of the green pixels.

The present invention exhibits the following advantages:

(1) Since only one of the R-, G-, and B-light-absorbing filters is used to reduce external light reflection, only one type of material and only one patterning process are required for forming the filter.

(2) In particular, only a G-light-absorbing filter is provided at the output side of light or at the incident side of external light of R and B pixels; thus, the contrast is significantly improved, and only one type of material and only one patterning process are required for forming the filter.

(3) Since the pixels containing the organic EL device each have an optical resonator structure, these pixels have high brightness.

(4) an R-light-transmitting filter and a B-light-transmitting filter are provided at the output side of light or at the incident side of external light of the corresponding red and blue pixels. Since these filters effectively absorb external light, the contrast is significantly improved.

Additional features and advantages of the present invention are described in, and will be apparent from, the following Detailed Description of the Invention and the Figures.

DETAILED DESCRIPTION OF THE INVENTION

First Embodiment

Figure 1A:
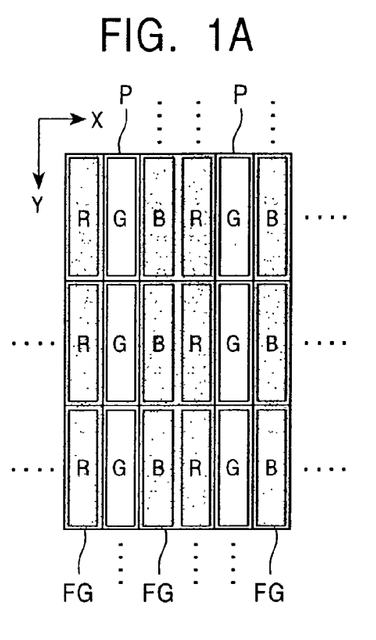
FIGS. 1A to 1D are schematic plan views each illustrating a combination of light-emitting pixels and a filter (or filters) according to the present invention.

A first embodiment of the present invention will now be described in detail. Referring to FIG. 1A, R, G, and B light-emitting pixels are arranged in a predetermined sequence in a two-dimensional array. In this drawing, R, G, and B pixels are repeated in the X direction, whereas pixels of the same color are repeated in the Y direction. A combination of consecutive R, G, and B pixels in the X direction constitutes an image pixel P. In this embodiment, the R pixels and the B pixels each have a G-light-absorbing filter FG at the image display side (light output side or external-light incident side) thereof. The G pixels have no filters.

Figure 2:
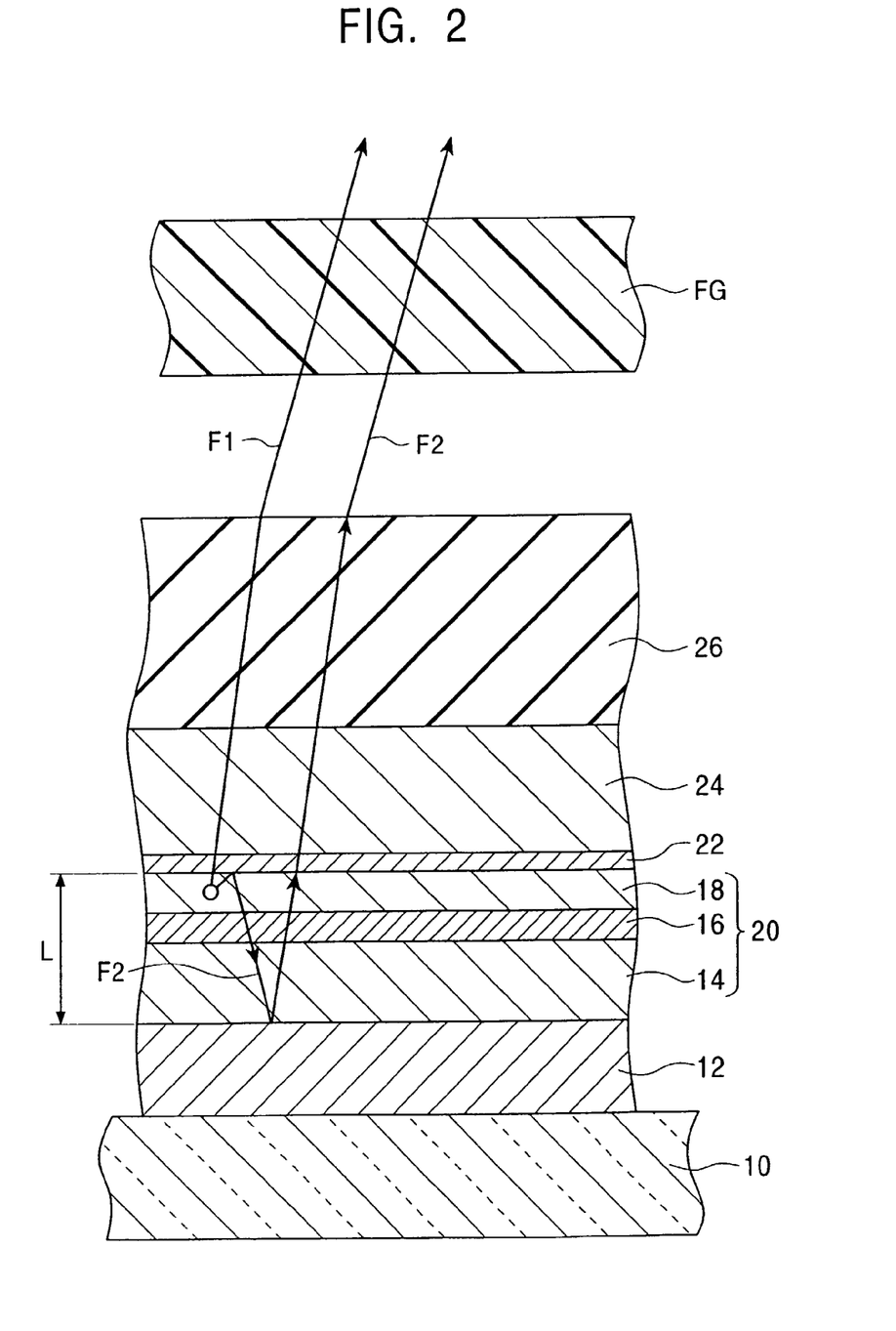
FIG. 2 is a cross-sectional view of a light-emitting pixel according to a first embodiment of the present invention.

FIG. 2 shows a composite structure of an R or B light-emitting pixel. A reflective layer 12, which is composed of Pt, Au, Cr, or W and which also functions as an anode, is deposited on a glass substrate 10. A buffer layer 14 composed of m-MTDATA, 2-TNATA, or the like is deposited on the reflective layer 12, and a hole transport layer 16 composed of α-NPD or the like is formed on the buffer layer 14. A luminescent layer 18, which is composed of Alq3 or the like and which also functions as an electron transport layer, is formed on the hole transport layer 16. The buffer layer 14, the hole transport layer 16, and the luminescent layer 18 constitute an organic EL layer 20.

A translucent reflective layer 22, which is composed of a Mg—Ag alloy and which also functions as a cathode, is deposited on the organic EL layer 20. A transparent conductive layer 24 composed of ITO or the like is formed on the translucent reflective layer 22, and a passivation film 26 composed of SiN or the like is formed on the transparent conductive layer 24. The above-mentioned G-light-absorbing filter FG is formed on the passivation film 26.

Preferable thicknesses of these layers are as follows:
(1) reflective layer 12: 100 to 300 nm,
(2) buffer layer 14: 15 to 300 nm,
(3) hole transport layer 16: 15 to 100 nm,
(4) luminescent layer 18: 15 to 100 nm,
(5) translucent reflective layer 22: 5 to 50 nm,
(6) transparent conductive layer 24: 30 to 1,000 nm, and
(7) passivation film 26: 500 to 10,000 nm.

The operation of the light-emitting pixels will now be described with reference to FIG. 2. A fraction F1 of light emitted from the luminescent layer 18 of the organic EL layer 20 passes through the translucent reflective layer 22, the transparent conductive layer 24, and the passivation film 26 and is incident on the G-light-absorbing filter FG. Another fraction F2 of the light emitted from the luminescent layer 18 is reflected by the translucent reflective layer 22 and the reflective layer 12. In other words, the translucent reflective layer 22 and the reflective layer 12 constitute an optical resonator structure that causes multiple interference of light. Since the optical resonator structure functions as a type of narrow band filter, the half width of the spectrum of the output light decreases, resulting in improved chromatic purity.

The peak wavelength of the narrow band filter is brought into line with the peak wavelength of the spectrum of the output light. More specifically, the peak wavelength λ of the spectrum of the light emitted and output from the organic EL layer 20 satisfies equation (1):

$$2L/\lambda + \Phi/2\pi = m \quad (m: \text{integer}) \tag{1}$$

wherein L represents the optical distance between the reflective layer 12 and the translucent reflective layer 22 (optical thickness of the organic EL layer 20), and Φ represents the phase shift (radian) between the light components reflected by the translucent reflective layer 22 and the reflective layer 12. Preferably, the optical distance L and the peak wavelength λ are both on the same order. In practice, these values are set so that the optical distance L of the optical resonator has the positive minimum within the range satisfying equation (1) above.

Figure 3:
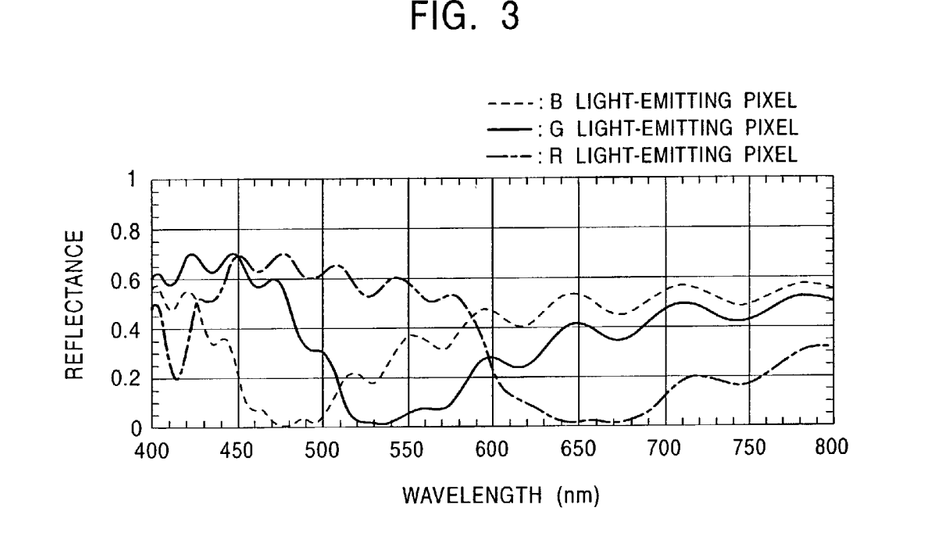
FIG. 3 is a graph of the external light reflectance of a light-emitting pixel not having a G-light-absorbing filter.

Such a condition agrees with a condition for maximizing the light transmittance. In other words, this condition minimizes the reflection of external light. Concerning the external light, FIG. 3 shows the external light reflectance R(λ) of the light-emitting pixels when no G-light-absorbing filters FG are provided. In FIG. 3, spectra R, G, and B represent the reflectances of the external light at the R, G, and B light-emitting pixels, respectively. As described above, the optical resonator must minimize the reflectance of the external light. For example, in the B light-emitting pixel, the reflectance of the B external light (about 450 to 500 nm) is minimized. The reflectances of the R and G light-emitting pixels are also shown in FIG. 3.

Figure 4:
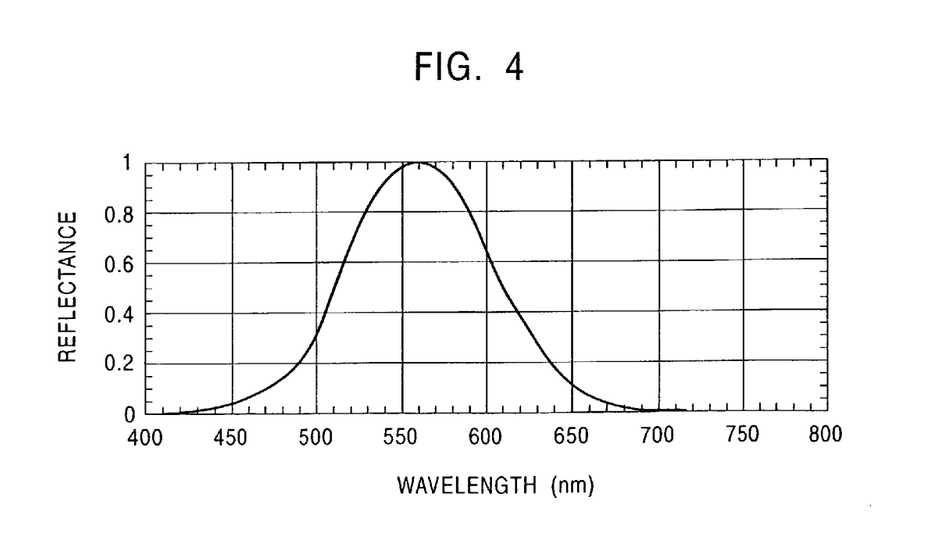
FIG. 4 is a graph of the luminosity curve of the naked eye.

FIG. 4 shows a luminosity curve y(λ), which indicates the sensitivity of the naked eye. The curve has a maximum in the green region. Thus, the naked eye observes the external light reflectances shown in FIG. 5, which are products of the reflectances R(λ) shown in FIG. 3 and the luminosity curve y(λ) shown in FIG. 4. According to FIG. 5, the reflectance at each peak wavelength of emitted light is quite low on the order of a few percent. For example, the reflectance of B external light at the B light-emitting pixel is substantially zero percent. As shown by an arrow F5 (at a wavelength 550 nm), the reflectance of G external light at the R light-emitting pixel is 0.6, and the reflectance of G external light at the B light-emitting pixel is about 0.4. These values are considerably high levels.

Figure 6:
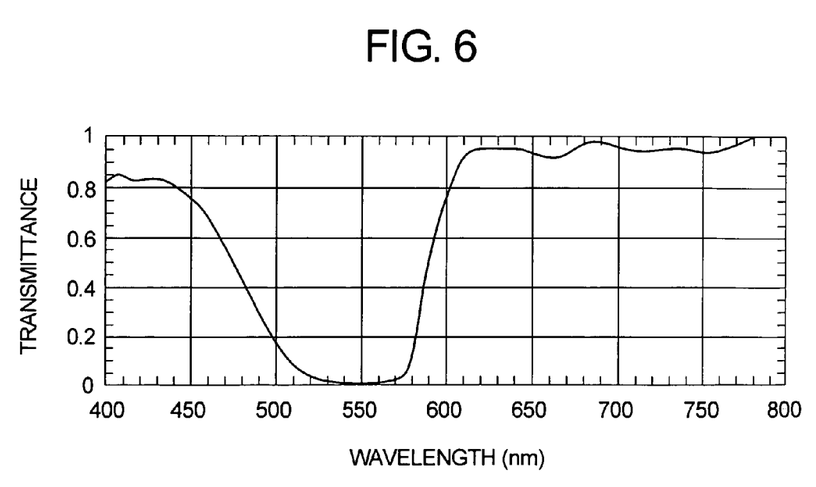
FIG. 6 is a graph of transmittance of a G-light-absorbing filter.

In this embodiment, as shown in FIG. 1A, the G-light-absorbing filters FG are provided on the R and B light-emitting pixels. The G-light-absorbing filter FG has a transmission characteristic T(λ), for example, shown in FIG. 6. In FIG. 6, the transmittance is minimized at the G light wavelength and is maximized at the R and B light wavelengths. In other words, the G-light-absorbing filter FG almost completely absorbs G light and almost completely transmits R light and B light. As described above, the naked eye has high sensitivity at the G light wavelength (see FIG. 4).

The external light is incident on the light-emitting pixel through the G-light-absorbing filter FG and emerges from the light-emitting pixel through the G-light-absorbing filter FG. When the G-light-absorbing filters FG are arranged on the R and B light-emitting pixels, the reflectance Rt(λ) of the external light is a product of the reflectances R(λ) shown in FIG. 3 and square the transmission characteristic T(λ) shown in FIG. 6, as represented by equation (2):

$$Rt(\lambda) = T(\lambda)(R(\lambda)(T(\lambda)) \quad (2)$$

Figure 7:
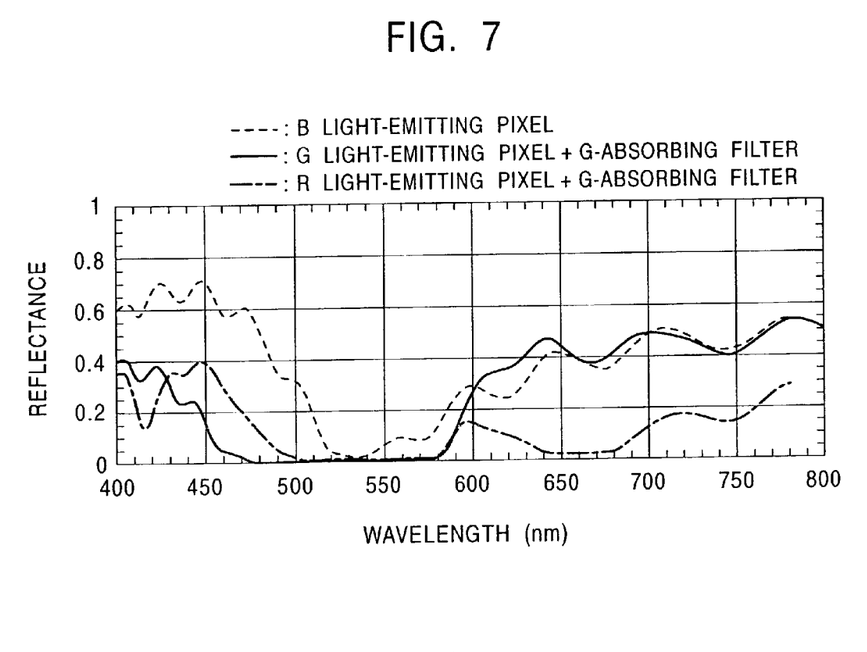
FIG. 7 is a graph of the external light reflectance including the G-light absorbing filter.

FIG. 7 is a graph corresponding to the equation (2). The reflectance of external light at the G region for each color light-emitting pixel is quite low.

The luminosity curve y(λ) of the naked eye is shown in FIG. 4, as described above. Thus, in this embodiment, the reflectance Re(λ) of external light in consideration of the luminosity curve y(λ) is represented by equation (3):

$$Re(\lambda) = Rt(\lambda)(y(\lambda)) \quad (3)$$

Figure 8:
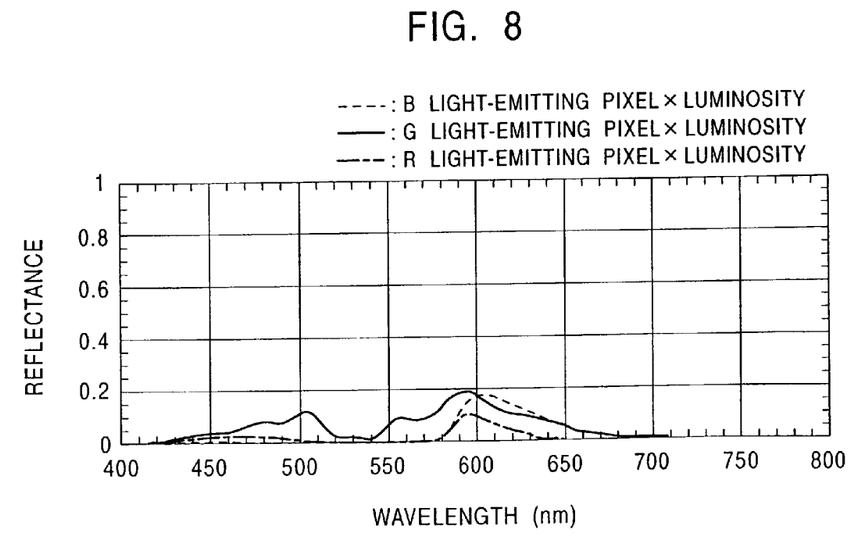
FIG. 8 is a graph of the external light reflectance including the luminosity and the G-light-absorbing filter.

FIG. 8 is a graph showing this curve.

Figure 5:
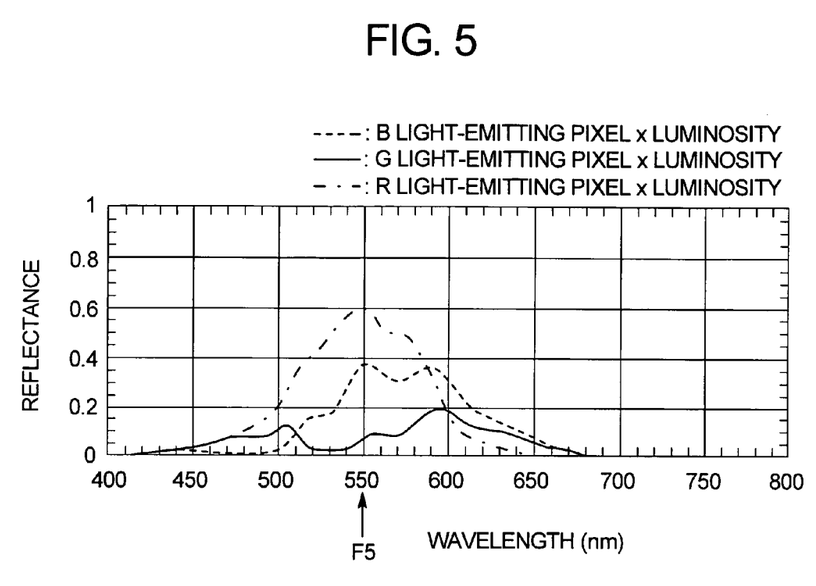
FIG. 5 is a graph of the external light reflectance including the luminosity.

The reflectance Re(λ) by the G-light-absorbing filter FG according to this embodiment (FIG. 8) is compared with the reflectance R(λ)×y(λ) without the G-light-absorbing filter FG (FIG. 5). The graph for the G light-emitting pixel is the same in FIGS. 8 and 5. For the R and B light-emitting pixels, the reflectance of the external light in FIG. 8 is quite low over the entire visible light region and particularly in the G light region near 550 nm, demonstrating effective suppression of external light reflection.

Figure 9:
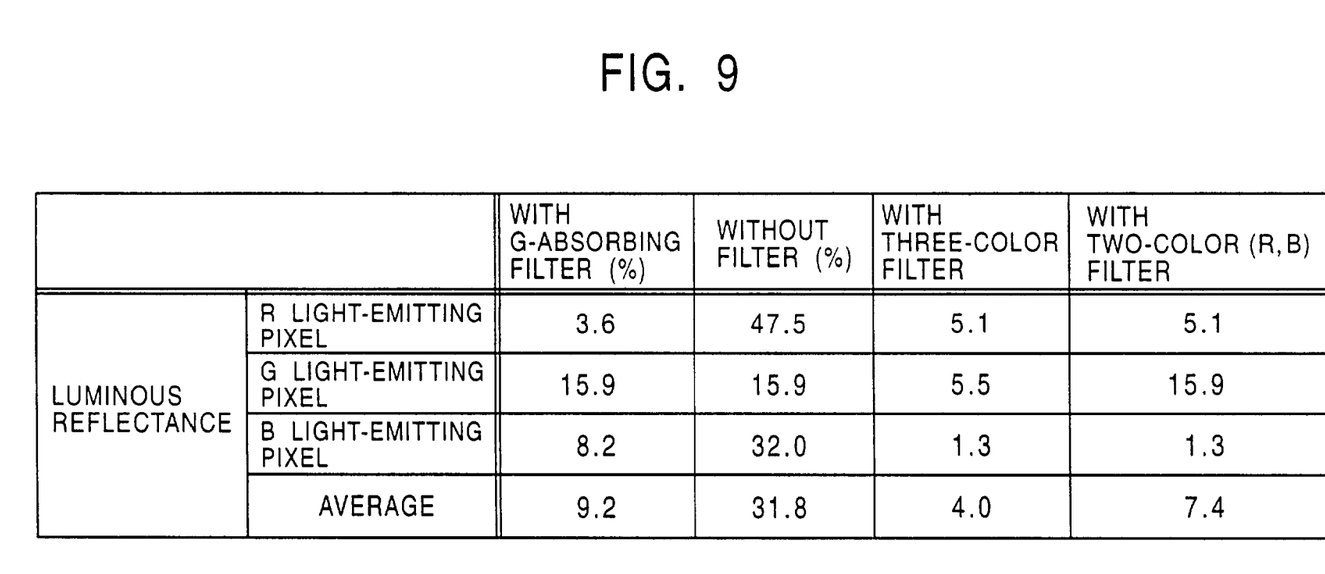
FIG. 9 is a table showing the relationship between R, G, and B light-emitting pixels having or not having filters and the luminous reflectance.

The ratio of the integral external light reflectance to the integral luminosity curve y(λ) over the entire visible light region is the luminous reflectance shown in FIG. 9. In FIG. 9, "with G-light-absorbing filter" refers to the ratio of the integral external light reflectance to the external light reflectance Re(λ) shown in FIG. 3: The ratio is 3.6 for the R light-emitting pixel, 15.9 for the G light-emitting pixel, 8.2 for the B light-emitting pixel, and 9.2 on average. Furthermore, "without G-light-absorbing filter" refers to the ratio shown in FIG. 5: The ratio is 47.5 for the R light-emitting pixel, 15.9 for the G light-emitting pixel, 32.0 for the B light-emitting pixel, and 31.8 on average. Thus, the G-light-absorbing filter can reduce the luminous reflectance to one-third or less on average. The luminous reflectance of the G light-emitting pixel does not change since it does not have the G-light-absorbing filter.

The G-light-absorbing filter FG has the transmission characteristic T(λ) shown in FIG. 6 for the signal light emitted from the organic EL layer 20. As shown in FIG. 6, the G-light-absorbing filter FG effectively transmits the signal light. Thus, the decrease in brightness of a displayed image can be minimized. Accordingly, compared with conventional display units, the display unit according to this embodiment exhibits a significantly high contrast under external light without a decrease in display brightness.

As shown in FIG. 9, in a conventional three-color filter in which R, G, and B transparent filters are provided on R, G, and B light-emitting pixels, respectively, the luminous reflectance is 5.1 for the R light-emitting pixel, 5.5 for the G light-emitting pixel, 1.3 for the B light-emitting pixel, and 4.0 on the average. These values are lower than these in this embodiment. However, the production of the three-color filter requires three types of filter material and three patterning processes, resulting in increased material and manufacturing costs. In contrast, only the G-light-absorbing filter FG is provided in this embodiment. Thus, this embodiment requires only one type of material and only one patterning process, resulting in high productivity with reduced material and manufacturing costs.

Figure 1B:
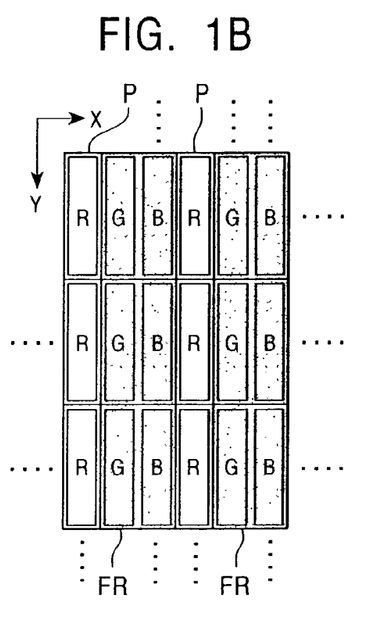
Figure 1C:
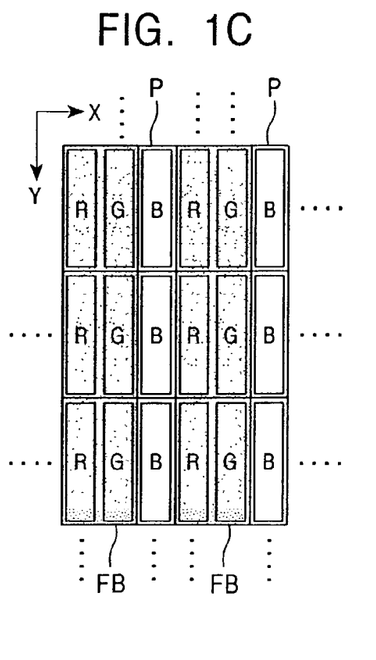

FIGS. 1B and 1C show modifications of the first embodiment. In FIG. 1B, R-light-absorbing filters FR are provided on G and B light-emitting pixels. In this modification, the external light reflectance is reduced at the R wavelength region of the graph shown in FIG. 5. In FIG. 1C, B-light-absorbing filters FB are provided on R and G light-emitting pixels. In this modification, the external light reflectance is reduced at the B wavelength region of the graph shown in FIG. 5.

Second Embodiment

Figure 10:
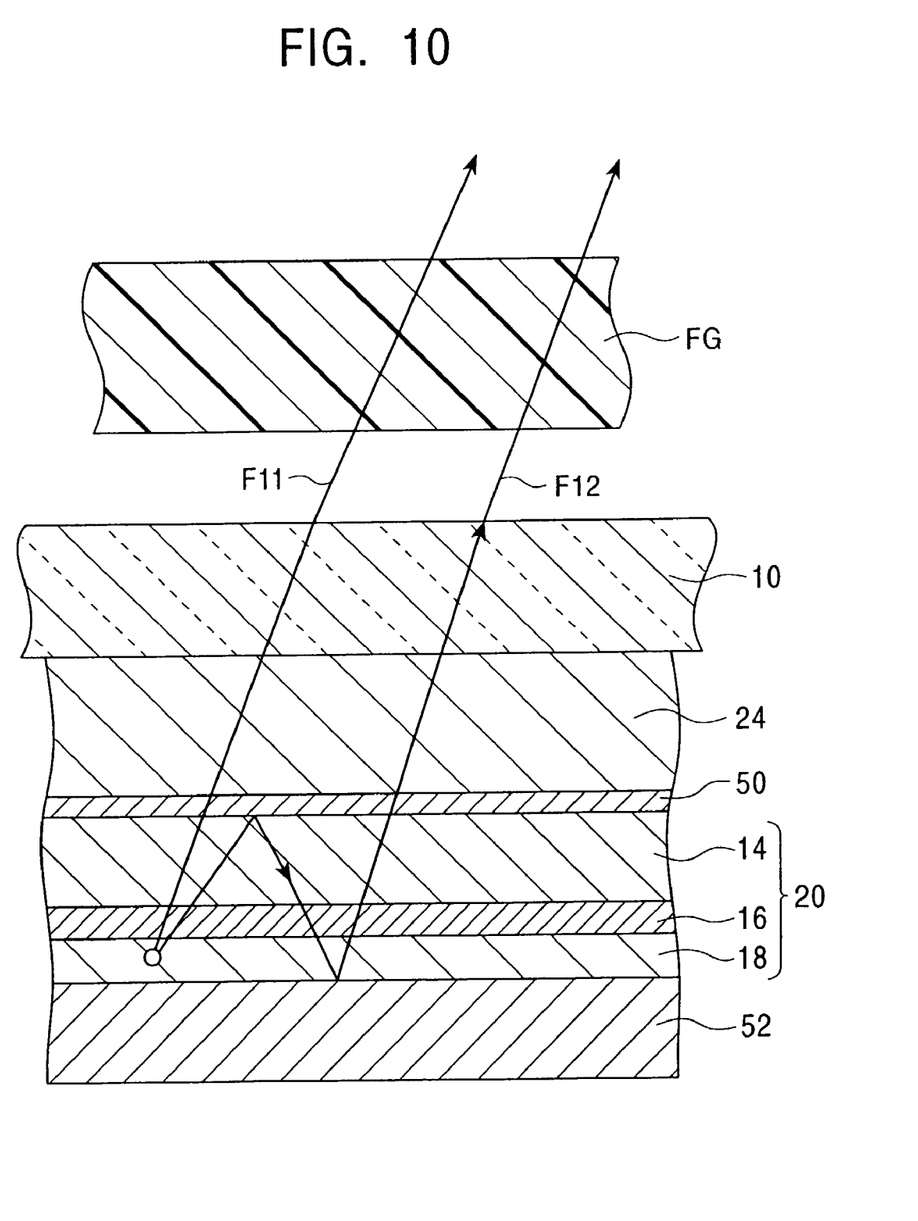
FIG. 10 is a cross-sectional view of a light-emitting pixel according to a second embodiment of the present invention.

Referring to FIG. 10, a second embodiment of the present invention will now be described. Components having the same functions as in the first embodiment are referred to with the same reference numerals. In this embodiment, light is output from the substrate side, unlike the first embodiment. A translucent reflective layer 50, a buffer layer 14, a hole transport layer 16, a luminescent layer 18, and a reflective layer 52 composed of aluminum or the like are deposited in that order on a substrate 10. Thus, the translucent reflective layer 50 is arranged at the substrate side. A G-light-absorbing filter FG is arranged on the substrate 10.

A fraction F11 of light emitted from the luminescent layer 18 of the organic EL layer 20 passes through the translucent reflective layer 50, transparent conductive layer 24, and the glass substrate 10 and is incident on the G-light-absorbing filter FG. Another fraction F11 of the light emitted from the luminescent layer 18 is reflected by the translucent reflective layer 50 and the reflective layer 52. In other words, the translucent reflective layer 50 and the reflective layer 52 constitute an optical resonator structure that causes multiple interference of light. The light passing through the substrate 10 emerges to the exterior through the G-light-absorbing filter FG. The second embodiment, therefore, has the same effects as the first embodiment.

Third Embodiment

Figure 11A:
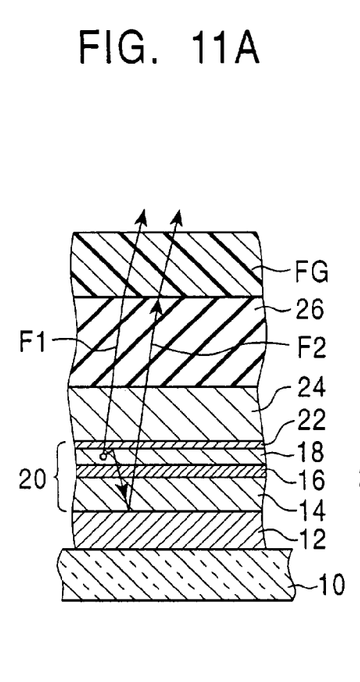
FIGS. 11A to 11D are cross-sectional views of light-emitting pixels according to a third embodiment of the present invention.
Figure 11B:
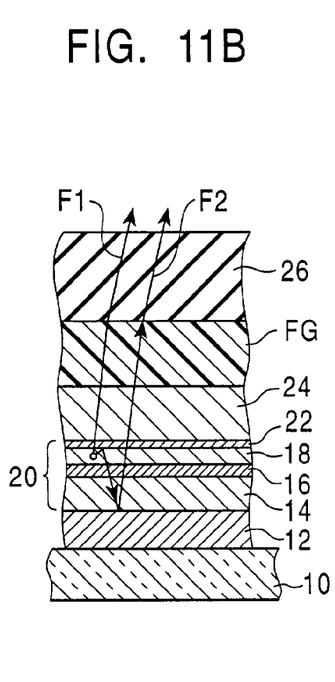
Figure 11C:
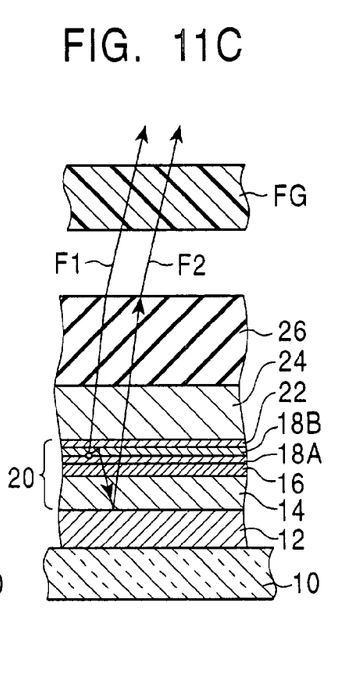

Referring to FIGS. 11A to 11D, a third embodiment of the present invention will now be described. In FIG. 11A, a G-light-absorbing filter FG is provided on a passivation film 26. In FIG. 11B, a G-light-absorbing filter FG is provided between a transparent conductive layer 24 and a passivation film 26. The only difference between these modifications and the first embodiment is the position of the G-light-absorbing filter FG. In the first embodiment, the luminescent layer 18 also functions as the electron transport layer. In FIG. 11C, both a luminescent layer 18A and an electron transport layer 18B are provided.

Figure 11D:
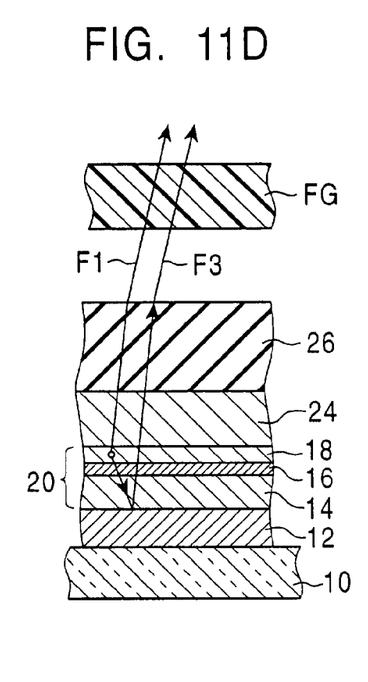

In the above embodiments, a reflective layer and a translucent reflective layer constitute an optical resonator structure. In FIG. 11D, no translucent reflective layer is provided. The light emitted from the organic EL layer 20 is directly incident on a G-light-absorbing filter FG, as shown by arrow F1, or is reflected by the reflective layer 12 and then is incident on the G-light-absorbing filter FG, as shown by arrow F3. Accordingly, this configuration has no optical resonator. Thus, the display unit of the present invention is also applicable to a general organic EL device having a reflective electrode (reflective layer 12) and a transparent electrode (transparent conductive layer 24). An example of such organic EL devices is disclosed in Japanese Unexamined Patent Application Publication No. 6-132081 in which a band pass filter is used to improve the chromaticity. When G-light-absorbing filters FG are provided on R and B light-emitting pixels of this organic EL device, as in the present invention, the organic EL device disclosed in the patent also has the same effects as those in the present invention. The display unit of the present invention requires only one type of material and only one patterning process, resulting in high productivity with reduced material and manufacturing costs, compared with the organic EL device disclosed in Japanese Unexamined Patent Application Publication No. 6-132081.

Fourth Embodiment

Figure 1D:
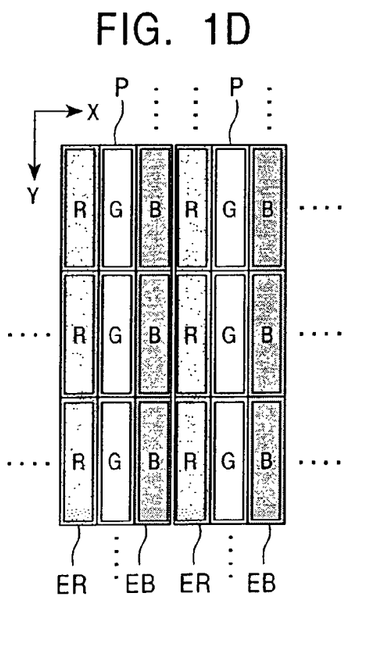

Referring to FIG. 1D, a fourth embodiment will now be described. In this embodiment, an R-light-transmitting filter ER is provided on an R light-emitting pixel and a B-light-transmitting filter EB is provided on a B light-emitting pixel. In other words, a G filter is omitted from a known display unit including R, G, and B color filters. That is, the above-mentioned G-light-absorbing filter FG corresponds to the R and B-light-transmitting filters ER and EB. As shown in FIG. 9, the luminous reflectance of the R light-emitting pixel with the R-light-transmitting filter is low, i.e., 5.1, and the luminous reflectance of the B light-emitting pixel with the B-light-transmitting filter is very low, i.e., 1.3.

A combination of the R light-emitting pixel with the R-light-transmitting filter and the B light emitting pixel with the B-light-transmitting filter shown in FIG. 1D exhibits higher luminous reflectance, i.e., 5.1 for the R light-emitting pixel, 15.9 for the G light-emitting pixel, 1.3 for the B light-emitting pixel, and 7.4 on average. Accordingly, the results in this embodiment are superior to those in the above-mentioned embodiments.

Other Embodiments

The display unit according to the present invention can include many embodiments and modifications as follows:

(1) In the above embodiments, the display unit is an organic EL display. The present invention is applicable to any pixel-matrix type of display. For example, the display unit of the present invention may be a liquid crystal display, a plasma display, or the like. Furthermore, the organic EL device may have any configuration and may be composed of any material.

(2) The above-mentioned layers may have any thickness and may be composed of any material.

Indeed, although the present invention has been described with reference to specific embodiments, those of skill in the art will recognize that changes may be made thereto without departing from the spirit and scope of the invention as set forth in the hereafter appended claims.

The invention claimed is:

1. A display unit, comprising:
   red, green, and blue pixels arranged in a predetermined sequence wherein each of the red, green and blue pixels has a structure including an organic EL layer between a reflective layer and a translucent reflective layer; and
   a single filter associated with at least two different color pixels, said filter selected from the group consisting of a green light-absorbing filter arranged at one of an output side of light and an incident side of external light of the translucent reflective layer associated with the red and blue pixels, a blue light-absorbing filter arranged at one of an output side of light and an incident side of external light of the translucent reflective layer associated with the red and green pixels, and a red light-absorbing filter arranged at one of an output side of light and an incident side of external light of the translucent reflective layer associated with the green and blue pixels, wherein the green light-absorbing filter is not arranged at one of the output side of light and the incident side of external light of the translucent reflective layer associated with the green pixels.

2. A display unit as claimed in claim 1, wherein each of the red, green and blue pixels has a structure including an organic EL layer between a reflective layer and a transparent layer, the filter being arranged at one of the output side of light and the incident side of external light of the transparent layer.

3. A display unit as claimed in claim 1, wherein the reflective layer and the translucent reflective layer constitute an optical resonator for outputting light components to be output from the corresponding pixel.

4. A display unit as claimed in claim 3, wherein the display unit is adjusted so that a peak wavelength λ of a spectrum of the light to be output satisfies the equation:

$$2L/\lambda + \Phi/2\pi = m$$

wherein m is an integer, L represents an optical distance between the reflective layer and the translucent reflective layer and Φ represents a phase shift of reflected light occurring in the optical resonator.

5. A display unit as claimed in claim 4, wherein the display unit is adjusted so that the optical distance L of the optical resonator has a positive minimum.

6. A display unit, comprising:
   red, green and blue pixels arranged in a predetermined sequence;
   a red-light-transmitting filter at one of an output side of light and an incident side of external light of the red pixels; and
   a blue-light-transmitting filter at one of an output side of light and an incident side of external light of the blue pixels;
   wherein no filter is arranged at one of an output side of light and an incident side of external light of the green pixels, wherein each of the red, green and blue pixels has a structure including an organic EL layer between a reflective layer and a translucent reflective layer, the filter being arranged at one of the output side of light and the incident side of external light of the translucent reflective layer, and wherein the reflective layer and the translucent reflective layer constitute an optical resonator for outputting light components to be output from the corresponding pixel, and wherein the optical resonator can act to suppress green external light.

7. A display unit as claimed hi claim 6, wherein the display unit is adjusted sp tat a peak wavelength λ of a spectrum of the light to be output satisfies the equation:

$$2L/\lambda + \Phi/2\pi = m$$

wherein in is an integer, L represents an optical distance between the reflective layer and the translucent reflective layer, and Φ represents a phase shift of reflected light occurring in the optical resonator.

8. A display unit as darned in claim 6, wherein the display unit is adjusted so that the optical distance L of the optical resonator has a positive minimum.

* * * * *